United States Patent
Prinz et al.

(10) Patent No.: US 7,364,969 B2
(45) Date of Patent: Apr. 29, 2008

(54) SEMICONDUCTOR FABRICATION PROCESS FOR INTEGRATING FORMATION OF EMBEDDED NONVOLATILE STORAGE DEVICE WITH FORMATION OF MULTIPLE TRANSISTOR DEVICE TYPES

(75) Inventors: Erwin J. Prinz, Austin, TX (US); Ramachandran Muralidhar, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 381 days.

(21) Appl. No.: 11/172,728

(22) Filed: Jul. 1, 2005

(65) Prior Publication Data
US 2007/0004146 A1    Jan. 4, 2007

(51) Int. Cl.
*H01L 21/336* (2006.01)
(52) U.S. Cl. ............... 438/258; 438/962; 257/E21.689
(58) Field of Classification Search ............... 438/211, 438/258, 260, 962; 257/E21.689
See application file for complete search history.

(56) References Cited

U.S. PATENT DOCUMENTS

| | | | | |
|---|---|---|---|---|
| 6,060,743 A | * | 5/2000 | Sugiyama et al. | 438/962 |
| 6,297,095 B1 | * | 10/2001 | Muralidhar et al. | 438/257 |
| 6,531,731 B2 | * | 3/2003 | Jones et al. | 257/314 |

* cited by examiner

*Primary Examiner*—Chandra Chaudhari
(74) *Attorney, Agent, or Firm*—Jackson Walker L.L.P.

(57) ABSTRACT

A semiconductor fabrication process includes forming polysilicon nanocrystals on a tunnel oxide overlying a first region of a substrate. A second dielectric is deposited overlying the first region and a second region. Without providing any protective layer overlying the second dielectric in the first region, an additional thermal oxidation step is performed without oxidizing the nanocrystals. A gate electrode film is then deposited over the second dielectric and patterned to form first and second gate electrodes. The second dielectric may be an annealed, CVD oxide. The additional thermal oxidation may include forming by dry oxidation a third dielectric overlying a third region of the semiconductor substrate. The dry oxidation produces a interfacial silicon oxide underlying the second dielectric in the second region. An upper surface of a fourth region of the substrate may then be exposed and a fourth dielectric formed on the upper surface in the fourth region.

17 Claims, 4 Drawing Sheets

SEMICONDUCTOR FABRICATION PROCESS FOR INTEGRATING FORMATION OF EMBEDDED NONVOLATILE STORAGE DEVICE WITH FORMATION OF MULTIPLE TRANSISTOR DEVICE TYPES

FIELD OF THE INVENTION

The present invention is in the field of semiconductor fabrication processes and more particularly, processes used to form devices that include thin film storage devices.

RELATED ART

System on Chip (SoC) devices refer to devices that integrate multiple types of blocks, including logic, programmable parts, I/O, analog blocks, volatile memory and non-volatile memory (NVM). Examples of state-of-the-art SoC's include microcontrollers for engine control, which contain a CPU, cache SRAM (static random access memory), numerous peripherals to connect to sensors and actuators, and an NVM for non-volatile code and data storage. To achieve non-volatility in a SoC, the CMOS (complementary metal oxide semiconductor) logic baseline process is modified to include or embed the process steps necessary to fabricate the NVM bitcell and the supporting devices such as peripheral high voltage transistors. For this reason, SoC processes are sometimes referred to as embedded NVM processes.

In most embedded NVMs, information is stored as charge on a "floating gate" which is completely surrounded by insulators, and which affects the threshold voltage of a transistor such that one bit of information corresponds to its on- and off-state. Charge is moved into and out of the floating gate by physical mechanisms such as hot-carrier injection or tunneling. Either method requires voltages higher than the core supply voltage. Using contemporary technology, a potential of approximately ±9 volts is required. To support these elevated voltages, peripheral transistors, referred to herein as high voltage or HV transistors are built with thicker-than-nominal gate oxides, and charge pump circuits are employed to generate high voltages from the chip supply voltage.

In earlier embedded NVM processes, conventional floating gate EEPROM (electrically erasable programmable read only memory) cells were used for the embedded NVM. It has been found, however, that there is a scaling limit for the insulator through which the charge is transported during the write and erase operations at high voltages. To maintain high reliability for safety-critical applications, the insulators surrounding the floating gate must be thicker than approximately 10 nm. This is because a single point defect in the insulator is sufficient to create a leakage path through which the entire floating gate charge can dissipate. This 10 nm insulator requirement represents a fundamental scaling limitation for floating gate based embedded NVM technology.

To address the scaling limitation of floating gate-based embedded NVM technology, "thin film storage" (TFS) memories have been developed. In a TFS memory, charge is stored in a thin insulating film that contains storage sites such as traps or small silicon crystals referred as nanocrystals. Unlike the conductive floating gate, the TFS insulating film prevents charges from moving easily from site to site so that a single oxide defect does not result in complete charge loss.

In one embodiment, nanocrystals are embedded between silicon dioxide layers at approximately 5 nm average spacing such that no conduction can occur between the nanocrystals. The device structure resembles a conventional floating gate bitcell in which the floating gate has been chopped into many small pieces that are essentially electrically isolated from one another. Write/erase mechanisms similar to the ones used in floating gate memories can be applied.

A problem inherent in nanocrystal processing is nanocrystal oxidation. Thermal oxidation steps performed after the nanocrystals are formed may oxidize the nanocrystals rendering them ineffective for charge storage. Further, the oxidizing agent can diffuse through the tunnel oxide between nanocrystals and cause undesirable increase in tunnel oxide thickness under the nanocrystals. Protect layers have been used to prevent oxidation of nanocrystals, but these protect layers add cost and complexity to the fabrication process. It would be desirable to implement a fabrication process that facilitated the integration of TFS devices with a minimum of additional cost and complexity.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Generally speaking, the invention encompasses a semiconductor fabrication, and the resulting devices, in which multiple types of devices, each having its own corresponding gate dielectric thickness, are formed. Included in device types are a thin film storage (TFS) device and a high voltage device required to program and erase the TFS device. The TFS device includes a charge retention element such as silicon nanocrystals or a layer of silicon nitride. Limiting the amount of post formation oxidation to which the charge storage element is subjected is achieved by using the gate dielectric of the high voltage devices as a top dielectric layer for the charge storage element.

Figure 1:
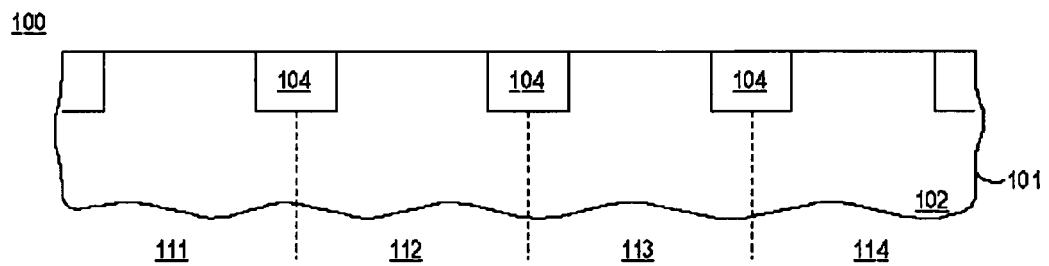
FIG. 1 is a partial cross sectional view of a semiconductor wafer emphasizing regions of the wafer in which thin film storage (TFS) devices, high voltage devices, I/O devices, and low voltage devices are fabricated.

Turning now to the drawings, FIG. 1 depicts a partial, cross-sectional view of a partially completed integrated circuit 100. Integrated circuit 100 is a representative of a class of devices referred to herein as system on chip (SoC) devices. SoC devices include multiple types of devices. Specifically, integrated circuit 100 includes a programmable nonvolatile storage element and a device, referred to herein as a high voltage device, suitable for programming and erasing the nonvolatile storage element. In addition, integrated circuit 100 may include low voltage devices suitable for use in the internal logic of integrated circuit 100 and I/O devices suitable for driving external signals.

As depicted in FIG. 1, the different device types of integrated circuit 100 will be fabricated in different physical regions of the wafer. FIG. 1 emphasizes four different regions of a semiconductor wafer 101 in which integrated circuit 100 is fabricated, namely, a first region 111, a second region 112, a third region 113, and a fourth region 114. An isolation dielectric structure 104, such as a conventional shallow trench isolation (STI) structure, is shown between each of the regions 111-114 of wafer 101. Within each region, multiple transistors and other devices may be formed. Moreover, each region 111-114 of wafer 100 may include PWELL regions and NWELL regions to fabricate device types of different polarities (i.e., NMOS devices and PMOS devices). For the sake of clarity, the well regions of wafer 101 are not depicted. Moreover, it will be appreciated that the layout of regions 111-114 as depicted in FIG. 1 is suitable for illustrating the invention, but is not intended to be restrictive of the layout of any particular implementation of the invention. For example, although FIG. 1 depicts region 111 adjacent to region 112, which is adjacent to region 113, which is adjacent to regions 114, other implementations are likely to result in different layouts of the various regions.

For purposes of illustrating the SoC implementation, first region 111 of wafer 101 is also referred to herein as the TFS region 111, second region 112 is referred to as high voltage (HV) region 112, third region 113 is referred to as I/O region 113, and fourth region 114 is referred to as low voltage (LV) region 114. As implied by these names, the depicted implementation of integrated circuit 100 will include nonvolatile storage devices and at least three different types of transistors. The different types of transistors include high voltage transistors, which will be fabricated in high voltage region 112, I/O transistors which will be fabricated in I/O region 113, and low voltage transistors, which will be fabricated in region 114. Although each of these device types share the basic characteristics of a field effect transistor (FET), the dielectric for each device type is likely to be unique. In one embodiment, for example, the gate dielectric of high voltage devices formed in region 112 is preferably thicker than the gate dielectric of I/O devices in I/O region 113 and low voltage devices in low voltage region 114. In addition, TFS devices in TFS region 111 include a charge storage element that is disposed overlying a gate dielectric.

In conventional NVM devices, the charge storage element is a floating gate made of doped polysilicon. In TFS devices formed in TFS region 111 of integrated circuit 100 according to the present invention, however, the charge storage element is non-conductive. Using a non-conductive charge storage element in TFS region 111 improves the reliability of the TFS devices. More specifically, TFS devices employing non-conductive charge storage elements are more immune to charge loss through defects in the underlying dielectric. Whereas even a single defect in the oxide of a conventional floating gate structure is capable of enabling all of the charge stored on the floating gate to leak off, electrically isolated charge storage elements are better able to retain charge because the stored charge cannot easily migrate to a localized defect.

Figure 2:
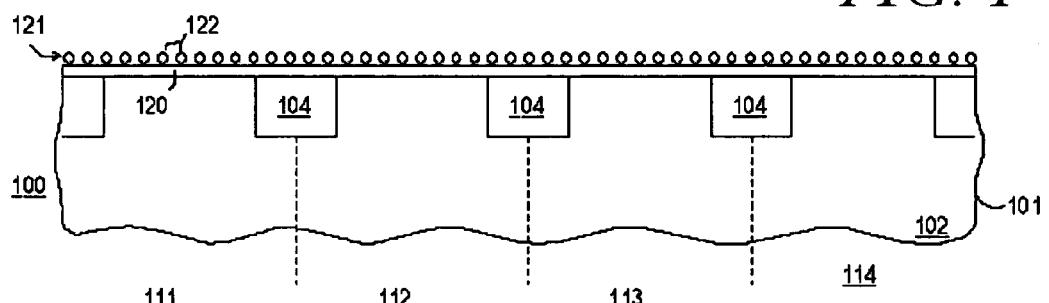
FIG. 2 is depicts processing subsequent to FIG. 1 in which a first dielectric is formed overlying the wafer and silicon nanocrystals formed on the first gate dielectric.

Referring now to FIG. 2, formation of a TFS device in integrated circuit includes forming a first dielectric 120, also referred to as tunnel dielectric 120, and a charge storage element 121 overlying the tunnel dielectric. In one embodiment, tunnel dielectric 120 is a thermally formed (dry or wet) silicon dioxide film having a thickness of approximately 5-7 nm. In other embodiments, however, first dielectric 120 may include SiON, SiN, a chemically vapor deposited silicon-oxide compound, a metal-oxide dielectric, or another suitable dielectric.

The charge storage element 121 formed overlying tunnel dielectric 120 is implemented in the depicted embodiment using silicon nanocrystals 122. Silicon nanocrystals 122 are discreet (discontinuous) silicon structures deposited on tunnel dielectric 120. Preferably, the density of these nanocrystals 122 is in the range of approximately 1E11 to 1E12 $cm^{-2}$ and the diameter of each nanocrystal is approximately 3-8 nm. Silicon nanocrystals 122 are preferably formed by low pressure CVD using a silane precursor. In one embodiment, the CVD pressure is in the range of approximately 50 to 150 mTorr and the CVD temperature is in the range of approximately 550 to 650° C. Deposition time is controlled in the range of approximately 0.1 to 15 minutes to maximize nanocrystal density. Silicon nanocrystals 122 are a desirable charge storage element because they achieve better reliability than conventional floating gates for thin tunnel oxides (7 nm and less). Conventional floating gates are susceptible to stored charge leakage from a single defect in the tunnel oxide whereas stored charge in nanocrystals 122 cannot migrate to oxide defects because of the discontinuities between adjacent nanocrystals. Although charge storage element 121 is preferably implemented with silicon nanocrystals, other implementations are possible including implementations (not depicted) in which the charge storage element 121 is a continuous silicon nitride structure. Alternately, nanocrystals of silicon germanium alloys or metals can be used.

Figure 3:
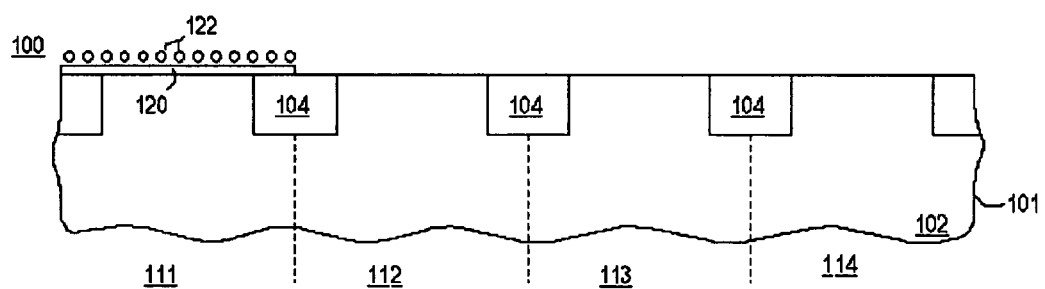
FIG. 3 depicts processing subsequent to FIG. 2 in which the first gate dielectric and the nanocrystals layers are removed except overlying the TFS region of the wafer.

In FIG. 3, the layer of silicon nanocrystals 122 and the underlying tunnel dielectric 120 are patterned using conventional photolithography and etch techniques. In the depicted representation of integrated circuit 100, polysilicon nanocrystals 122 and tunnel dielectric 120 are removed from all regions of wafer 101 except the TFS region 111. This patterning of tunnel dielectric 120 exposes an upper surface of regions 112-114 of wafer 101. It is significant that the charge storage element 121 and tunnel dielectric 120 are etched prior to providing a control oxide overlying the charge storage element. In conventional processes employing embedded NVM devices, patterning the tunnel oxide and charge storage element is typically performed only after depositing a control oxide. By delaying formation of the control oxide, the present invention is able to integrate the formation of the TFS control oxide with the formation of a gate dielectric for another device thereby reducing the processing steps and the amount of high temperature processing to which the charge storage element is subjected.

An important consideration for processes that use silicon nanocrystals for a charge storage element in a thin film storage device is the oxidation of the nanocrystals during subsequent processing steps. Care must be taken to ensure that any subsequent processing steps that employ an oxygen bearing ambient at elevated temperatures do not consume the nanocrystals. The present invention addresses this concern by integrating the formation of a control dielectric for TFS region 111 with the formation of a gate dielectric for HV region 112.

Figure 4:
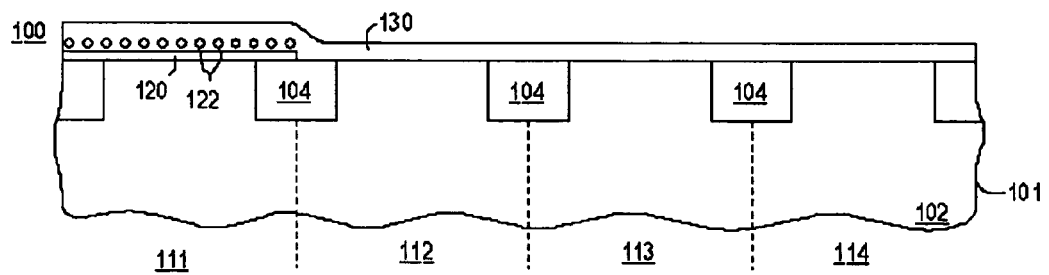
FIG. 4 depicts processing subsequent to FIG. 3 in which a second dielectric is formed where part of the second dielectric overlies the nanocrystals.

Referring now to FIG. 4, a second dielectric 130, also referred to herein as shared dielectric 130, is formed non-selectively so that shared dielectric 130 overlies tunnel dielectric 120 and silicon nanocrystals 122 in TFS region 111 of wafer 101 and the upper surface of wafer 101 in HV region 112 of wafer 101. In one embodiment, shared dielectric 130 is a CVD silicon oxide referred to as high temperature oxide (HTO) formed by reacting dichlorosilane and nitrous oxide at a temperature of approximately 900° C. The deposited oxide is preferably annealed in an inert ambient to densify and relax the deposited film. The thickness of shared dielectric 130 is preferably in the range of approximately 7 to 25 nm. As it names implies, shared dielectric 130 servers multiple functions in integrated circuit 100. Specifically, shared dielectric 130 will serve as a control oxide for TFS devices formed in TFS region 111 while also serving as at least a portion of the gate dielectric for high voltage devices formed in HV region 112.

By using the TFS device control oxide as the gate dielectric for the HV devices, the amount of high temperature oxidation processes to which silicon nanocrystals are exposed is reduced. Whereas a conventional SoC fabrication process deposits the TFS control oxide separately from the formation of the HV device gate dielectric to maintain independent control over the thickness of both films, the present invention reduces thermal budget by eliminating the requirement for a dedicated HV gate dielectric formation. This reduction in high temperature processing beneficially reduces the amount of nanocrystal oxidation that occurs, resulting in minimal degradation for the TFS devices in integrated circuit 100.

Figure 5:
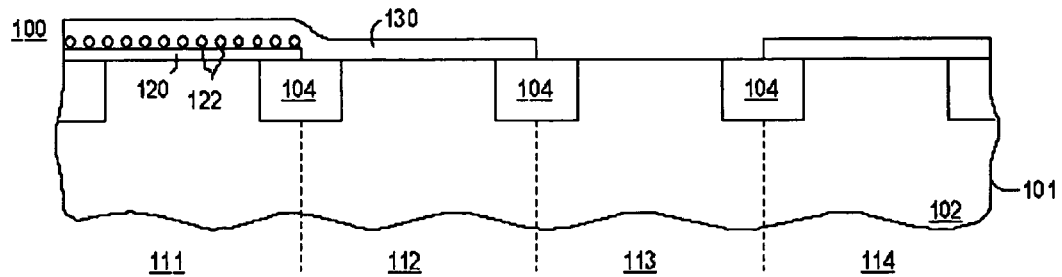
FIG. 5 depicts processing subsequent to FIG. 4 in which portions of the second dielectric overlying the I/O device region are removed.

Referring now to FIG. 5 through FIG. 8, a first alternative processing sequence following formation of shared dielectric 130 is depicted. (A second alternative processing sequence will be described below with respect to FIG. 9 through FIG. 12.) Referring to FIG. 5, portions of shared dielectric 130 overlying I/O region 113 of wafer 101 are removed to expose an upper surface of I/O region 113. Selective removal of shared dielectric 130 is preferably achieved using conventional mask and etch techniques. For embodiments in which shared dielectric 130 is a silicon oxide compound, etching is may be achieved using dilute HF or any other suitable oxide etchant.

Figure 6:
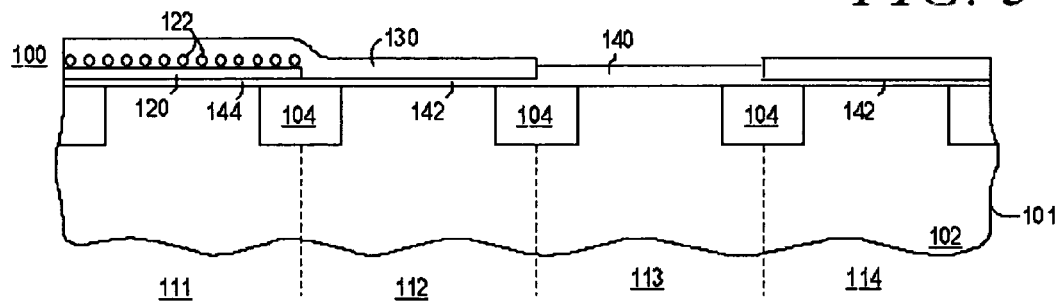
FIG. 6 depicts processing subsequent to FIG. 5 in which a third dielectric is formed overlying the I/O device region.

In FIG. 6, a third dielectric 140, also referred to as I/O dielectric 140 is formed. In one embodiment, I/O dielectric 140 is a thermally formed silicon dioxide film having a thickness in the range of 5 to 7 nm. In a preferred embodiment, I/O dielectric 140 is formed in a conventional manner by exposing wafer 101 to a dry (i.e., non-steam) oxygen-bearing ambient at an elevated temperature. In this embodiment, the thermal formation of I/O dielectric 140 results in the simultaneous formation of a first interfacial oxide 142 underlying shared dielectric 130 over HV region 112 and the formation of a second interfacial oxide 144 underlying tunnel dielectric 120 over TFS region 111. Oxides 142 and 144 are thinner than I/O dielectric 140 and may be in the range of 1 to 3 nm. The presence of control oxide 130 overlying the silicon nanocrystals 122 during thermal formation of I/O dielectric 140 beneficially prevents or reduces the extent of nanocrystal oxidation. The presence of a thermally formed interfacial oxide 142 positioned between HV region 112 and shared dielectric 130, while increasing the overall dielectric thickness, may result in an improved silicon-dielectric interface and dielectric film for the subsequently formed HV devices.

Figure 7:
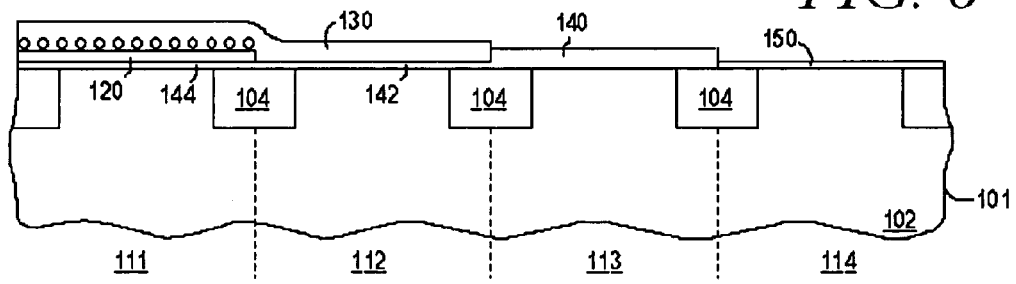
FIG. 7 depicts processing subsequent to FIG. 6 in which dielectrics overlying the low voltage device region are removed and a fourth dielectric is formed.

In FIG. 7, portions of shared dielectric 130 and interfacial oxide 142 overlying LV region 114 are removed using conventional mask and etch techniques to expose an upper surface of LV region 114. Thereafter, a fourth dielectric 150, also referred to herein as LV dielectric 150, is formed overlying LV region 114 of wafer 101. In one embodiment, LV dielectric 150 is a thermally formed silicon dioxide film having a thickness of approximately 1 to 4 nm. Although the thermal formation of LV dielectric 150 is likely to result in the formation of an additional film of silicon dioxide at the silicon interface in regions 111 through 113 of wafer 101, the thickness of this film is likely to be insignificant relative to the thickness of the existing dielectric in those regions. Accordingly, any film formed at the silicon interface in regions 111 through 113 of wafer 101 is not depicted in FIG. 7.

As depicted in FIG. 7, integrated circuit 100 includes unique dielectric structures for the four regions 111 through 114 of wafer 101. In this embodiment, the thickness of I/O dielectric 140 and LV dielectric 150 can be precisely specified independent of other process parameters. In contrast, the final thickness of the dielectric overlying HV region 112 is affected by the thickness of shared dielectric 130 and the thickness of oxide 142. The thickness of oxide 142, in turn, is determined in part by the oxidation parameters for I/O dielectric 140. Moreover, the thickness of shared dielectric 130 must be sufficient for providing a control oxide overlying silicon nanocrystals 122. In practice, it may be difficult to optimize all of these parameters simultaneously. Accordingly, an alternative implementation of the processing sequence that follows the processing depicted in FIG. 4 is shown in FIG. 9 through FIG. 13 below.

Figure 8:
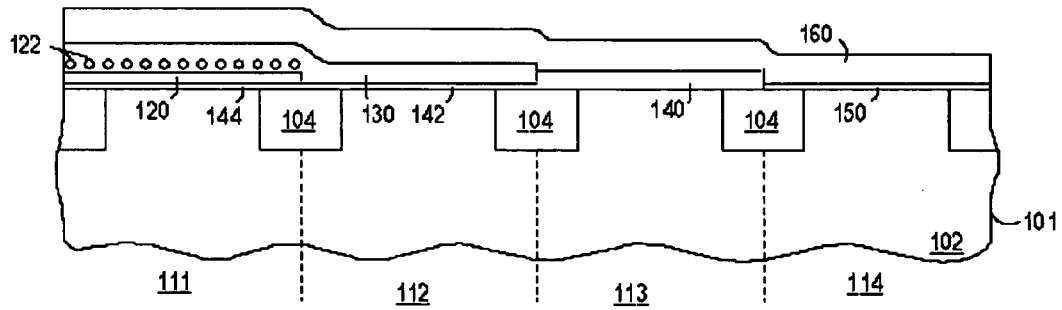
FIG. 8 depicts processing subsequent to FIG. 7 in which a conductive layer is formed overlying the wafer.
Figure 9:
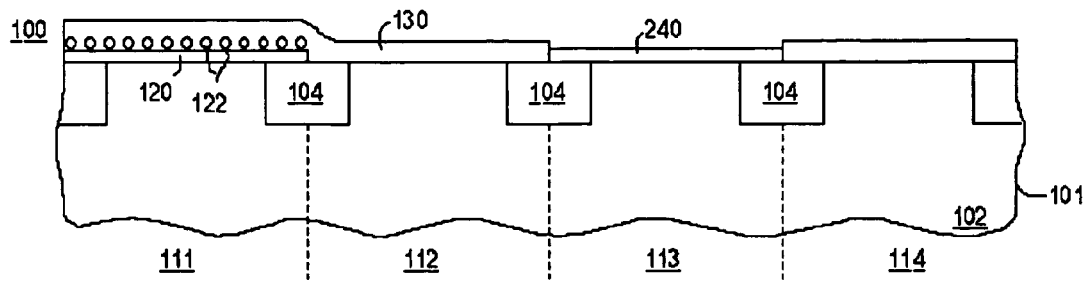
FIG. 9 depicts processing subsequent to FIG. 4 according to an alternative embodiment in which a top portion of the second dielectric overlying the I/O device region is removed.

Referring now to FIG. 8, a conductive gate electrode layer 160 is formed overlying the entire wafer 101. In one embodiment, conductive gate electrode layer 160 is a conventionally deposited polysilicon gate electrode layer having a thickness in the range of approximately 50 to 300 nm. In this embodiment, conductive gate electrode layer 160 may be doped either p-type or n-type to increase the film's conductivity. The doping may occur in situ during the deposition or post-deposition using ion implantation. In other embodiments, conductive gate electrode layer 160 may include materials other than or in addition to polysilicon. These other materials may include, as examples, tantalum, titanium nitride, tantalum silicon nitride, titanium, and other suitable metal materials. The present invention beneficially conserves processing steps by using a single gate electrode layer to form the gate electrodes for the different types of devices including TFS devices in TFS region 111 and the various transistor devices in regions 112 through 114.

Figure 13:
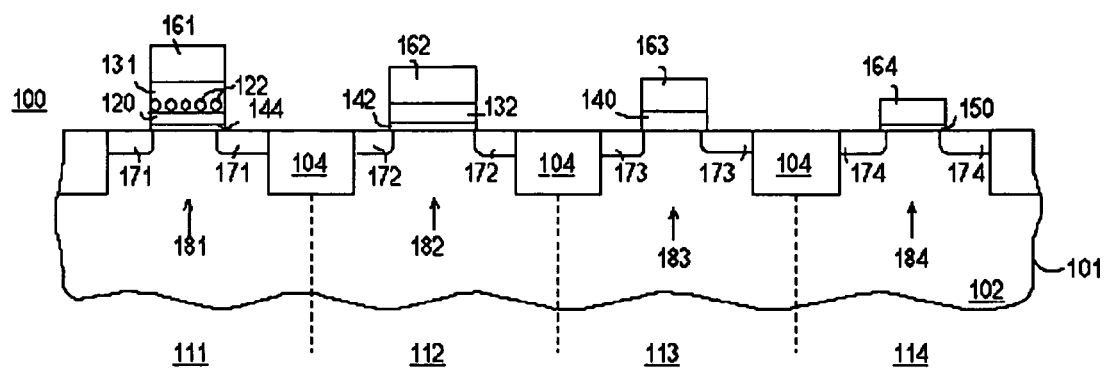
FIG. 13 depicts processing subsequent to FIG. 8 in which fabrication of a thin film storage device, a high voltage device, an I/O device, and a low voltage device is completed.

Referring now to FIG. 13, additional processing is performed on integrated circuit 100 to complete the fabrication of TFS device 181, a HV transistor 182, an I/O transistor 183, and an LV transistor 184. Specifically, the gate electrode layer 160 of FIG. 8 is patterned using conventional mask and etch techniques to form gate electrodes 161 through 164 overlying regions 111 through 114 respectively. Thereafter, p-type or n-type impurities are implanted into regions 111 through 114 to form source/drain regions 171 through 174 respectively. In this embodiment, TFS device 181 includes a gate electrode 161 overlying a control dielectric 131 that is formed from shared dielectric 130 (FIG. 8). Control dielectric 131 overlies a charge storage element such as the polysilicon nanocrystals 122 depicted in FIG. 13. The charge storage element overlies the tunnel dielectric 120 and, possibly, a nominal additional dielectric layer 144 that is formed during the formation of third dielectric 140.

The HV device 182 includes a gate electrode 162 overlying a gate dielectric 132 that is formed from shared dielectric 130 (FIG. 8). Gate dielectric 132 overlies a oxide 142 that is formed during the formation of third dielectric 140. As described above, the gate dielectric 132 is a deposited and annealed HTO film while oxide 142 is a thermally formed silicon dioxide. In this embodiment, it will be appreciated that the gate dielectric 132 of HV device 182 and the control oxide 131 of TFS device 181 are formed from a the same film, namely, the shared dielectric 130 of FIG. 8. Using the shared dielectric 130 for two purposes beneficially eliminates the need for a dedicated layer (sometimes referred to as a protect layer) to prevent oxidation of the polysilicon nanocrystals 122.

The I/O device 183 includes a gate electrode 163 overlying the third dielectric 140. The LV device 184 include a gate electrode 164 overlying the fourth gate dielectric 150. In one implementation as described above, the thickness of gate dielectric 132 is greater than the thickness of third gate dielectric 140, which is greater than the thickness of fourth gate electrode 150. In one embodiment, the operating voltage is approximately 6 to 9 V for HV transistor 182, 1.8-3.3 V for I/O transistors 183, and 0.9-1.5 V for LV transistor 184.

Referring now to FIG. 9 through FIG. 12, a second alternative sequence of processing steps to be performed after the processing depicted in FIG. 4 is shown. This alternative processing sequence beneficially enables independent control of the thickness of the TFS device control oxide, the HV gate dielectric, and the I/O device gate dielectric in exchange for the introduction of a special purpose etch step. Specifically, referring to FIG. 9, portions of shared dielectric 130 overlying third region 113 of substrate 102 are "thinned" to produce a third dielectric 240 having a thickness that is less than the thickness of shared dielectric 130. In one embodiment, thinning of gate dielectric 130 is achieved by subjecting the portions of second gate dielectric 130 overlying third region 113 to a very dilute HF solution (i.e. less than 100:1 $H_2O:HF$) or exposing the surface to a buffered oxide etch (BOE) using, for example, a solution of $NH_4F$ and HF as is known in the field.

Figure 10:
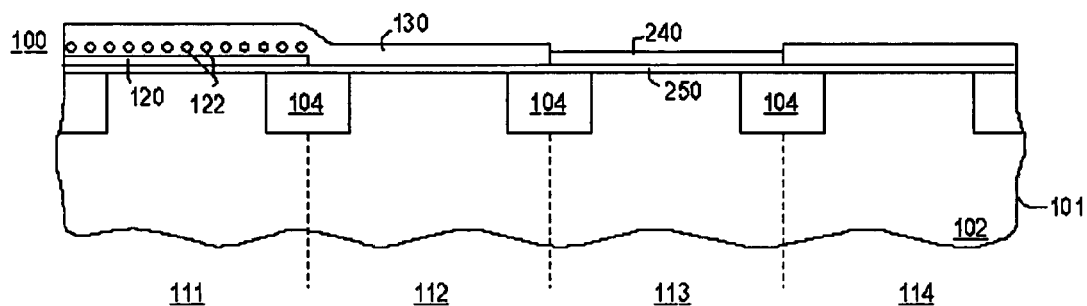
FIG. 10 depicts processing subsequent to FIG. 9 in which a third dielectric is formed.

In FIG. 10, an additional dielectric 250 is formed underlying third dielectric 240. This additional dielectric is optional and may improve the interface quality between the deposited oxide 240 and the silicon surface in area 113. In the preferred embodiment, additional dielectric 250 is a silicon dioxide film formed using a dry thermal oxidation process analogous to the process used to form additional dielectric 140 in FIG. 6. In this embodiment, the thermal oxidation process results in the simultaneous formation of a additional dielectric 250 underlying shared dielectric in regions 112 and 113 respectively.

Figure 11:
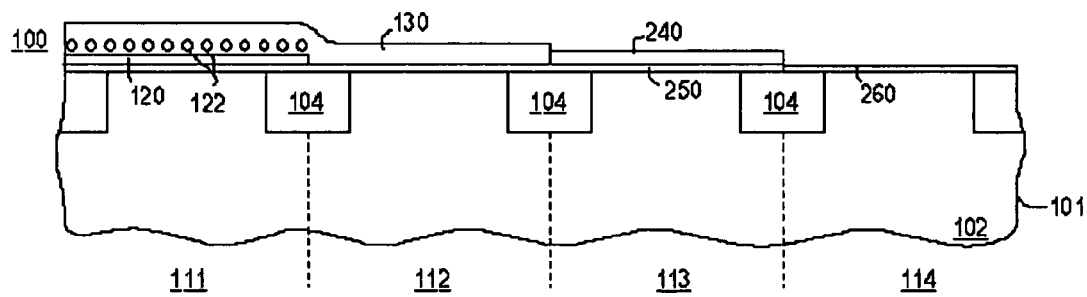
FIG. 11 depicts processing subsequent to FIG. 10 in which portions of the second and third dielectric overlying the low voltage region are removed and a fourth dielectric is formed.

In FIG. 11, portions of shared dielectric 130 and the additional dielectric 250 overlying fourth region 114 are removed and a fourth dielectric 255 is formed analogous to the formation of fourth dielectric 150 in FIG. 7. Like fourth dielectric 150, fourth dielectric 255 is preferably a thermally formed silicon dioxide film having a thickness in the range of approximately 1 to 5 nm.

Figure 12:
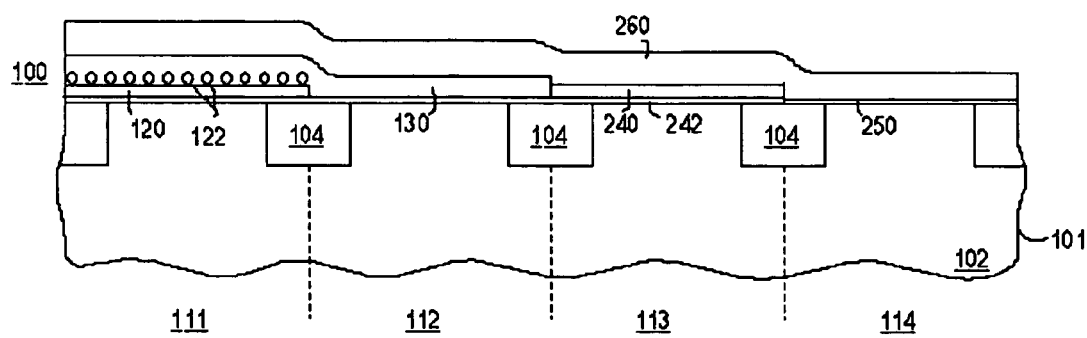
FIG. 12 depicts processing subsequent to FIG. 11 in which a conductive layer is formed over the wafer.

In FIG. 12, a conductive gate electrode layer analogous to conductive gate electrode layer 160 of FIG. 8 is deposited over wafer 101. Like gate electrode layer 160, gate electrode layer 260 is preferably conventional doped polysilicon although conductive layer 260 may include alternatives or additions to polysilicon.

Figure 14:
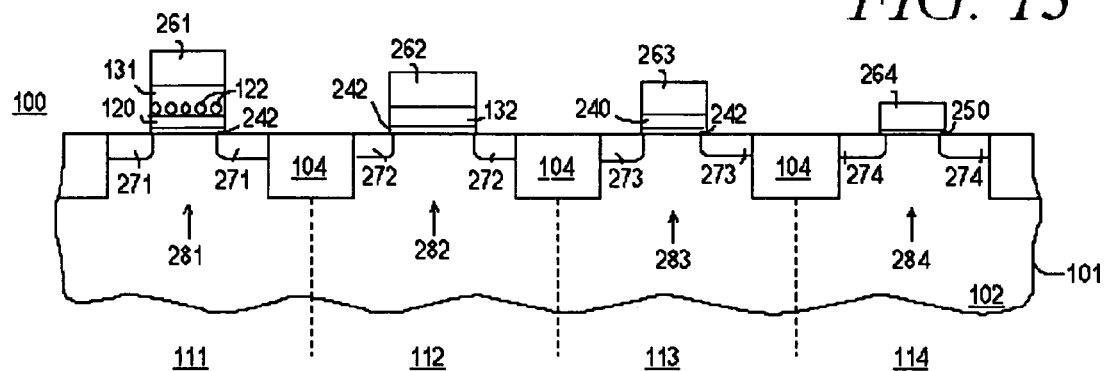
FIG. 14 depicts processing subsequent to FIG. 12 in which fabrication of a thin film storage device, a high voltage device, an I/O device, and a low voltage device is completed.

In FIG. 14, conductive gate electrode layer 260 is patterned to form gate electrodes 261 through 264 and, thereafter, source/drain implants performed to form source/drain regions 271 through 274. As depicted in FIG. 14, integrated circuit 100 according to the present invention includes a TFS device 281, an HV transistor 282, an I/O transistor 283, and an LV transistor 284. Like integrated circuit as depicted in FIG. 13, TFS device 281 includes a control oxide 131 and HV transistor 282 includes a gate dielectric 132 that are both formed from the shared dielectric 130.

In the foregoing specification, the invention has been described with reference to specific embodiments. However, one of ordinary skill in the art appreciates that various modifications and changes can be made without departing from the scope of the present invention as set forth in the claims below. For example, although the FIGs illustrate source/drain regions 171/271, 172/272, etc., other implementation may include extension implants, and/or halo implants, and the appropriate spacer structures, familiar to those in the field. In addition, the FIGs illustrate a single device in each region of wafer substrate 102, but it will be appreciated that there may be n-type devices and p-type devices in each substrate region. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A semiconductor fabrication process, comprising:
   forming a tunnel dielectric over first and second regions of a semiconductor substrate;

forming a charge storage element overlying the tunnel dielectric;

removing portions of the tunnel dielectric and the charge storage element overlying the second region;

forming a second dielectric overlying the first and second regions;

forming a conductive gate electrode layer overlying the second dielectric;

patterning the conductive gate electrode layer to form a first gate electrode overlying the first region and a second gate electrode overlying the second region;

forming first source/drain regions aligned to the first gate electrode in the first region and second source/drain regions aligned to the second gate electrode in the second region to form a thin film storage device in the first region and a high voltage transistor in the second region, wherein the second dielectric serves as a gate dielectric for the high voltage device and a control oxide for the thin film storage device.

2. The method of claim 1, wherein forming the tunnel dielectric comprises thermally forming a silicon dioxide film having a thickness of approximately 3-7 nm.

3. The method of claim 2, wherein forming the second dielectric comprises depositing a silicon oxide film by reacting an oxygen bearing species and a silicon bearing species in a CVD reactor chamber and thereafter annealing the silicon oxide film.

4. The method of claim 3 wherein a thickness of the second dielectric is in the range of approximately 5 to 15 nm.

5. The method of claim 1, wherein forming the charge storage element comprises forming a plurality of silicon nanocrystals.

6. The method of claim 1, wherein the semiconductor substrate includes a third region and wherein forming the second dielectric includes forming the second dielectric over the third region and wherein the method further comprises:

removing the second dielectric overlying the third region;

forming a third dielectric overlying the third region; and forming a third transistor in the third region, the third transistors including a third gate electrode overlying the third gate dielectric and third source/drain regions wherein the third transistor uses the third dielectric.

7. The method of claim 6, wherein forming the third dielectric comprises thermally forming a silicon dioxide film in a dry, oxygen bearing ambient.

8. The method of claim 7, wherein the semiconductor substrate includes a fourth region and wherein the method further comprises, following forming the third dielectric, exposing an upper surface of the fourth region and forming a fourth dielectric overlying the fourth region.

9. The method of claim 1, wherein the semiconductor substrate includes a third region and wherein forming the second dielectric includes forming the second dielectric over the third region and wherein the method further comprises thinning the portion of the second dielectric overlying the third region to form a third dielectric.

10. The method of claim 9, wherein thinning the third dielectric comprises exposing the portion of the second dielectric overlying the third region to a process selected from the group consisting of a very dilute HF etch to a buffered oxide etch.

11. The method of claim 10, further comprising, after forming the third dielectric, performing a dry oxidation process to form an interfacial oxide underlying the third dielectric in the third region and underlying the second dielectric in the second region.

12. A semiconductor fabrication process, comprising:

forming a plurality of silicon nanocrystals on a tunnel oxide selectively overlying a first region of a semiconductor substrate;

depositing a shared dielectric overlying the first region and a second region of the semiconductor substrate;

without providing any protective layer overlying the shared dielectric in the first region, performing at least one additional thermal oxidation step, wherein the presence of the shared dielectric overlying the silicon nanocrystals substantially prevents the additional thermal oxidation step from oxidizing the nanocrystals; and depositing a conductive gate electrode film overlying the shared dielectric and patterning the gate electrode film to form a first gate electrode overlying the first region and a second gate electrode overlying the second region.

13. The method of claim 12, wherein depositing the shared dielectric comprises chemically vapor depositing a silicon oxide dielectric and, thereafter, annealing the deposited dielectric.

14. The method of claim 13, wherein performing the at least one additional thermal oxidation includes performing a dry oxidation process to form a third dielectric overlying a third region of the semiconductor substrate.

15. The method of claim 14, wherein the dry oxidation process produces a interfacial silicon oxide film underlying the shared dielectric in the second region.

16. The method of claim 15, further comprising exposing an upper surface of a fourth region of the semiconductor substrate and thermally forming a fourth dielectric on the upper surface in the fourth region.

17. The method of claim 16, wherein a thickness of the shared dielectric is greater than a thickness of the third dielectric and wherein a thickness of the third dielectric is greater than a thickness of the fourth dielectric.

* * * * *